US 6,600,656 B1

(12) United States Patent
Mori et al.

(10) Patent No.: US 6,600,656 B1
(45) Date of Patent: Jul. 29, 2003

(54) SYSTEM STRUCTURE FOR FAST SERVICE ACCESS IN A RACK/CABINET

(75) Inventors: Robert F. Mori, Palo Alto, CA (US); Christopher H. Frank, Campbell, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/119,893

(22) Filed: Apr. 10, 2002

(51) Int. Cl.[7] .................................................. H05K 7/00
(52) U.S. Cl. ........................ 361/724; 361/797; 361/826; 174/168; 312/265.1
(58) Field of Search ................................. 361/681, 682, 361/683, 684, 724, 726, 727, 826, 725, 803, 728, 730, 736, 741, 752, 788, 796, 797; 381/109; 333/28 R; 334/85; 439/152, 153, 154, 155, 157, 160, 928.1, 377; 211/26, 175, 189; 312/265.1, 265.4; 174/69, 168, 128, 2

(56) References Cited

U.S. PATENT DOCUMENTS

| | | | | |
|---|---|---|---|---|
| 3,448,346 A | * | 6/1969 | Webb ............................ | 174/69 |
| 4,686,608 A | * | 8/1987 | Hoskins ........................ | 361/428 |
| 5,227,957 A | * | 7/1993 | Deters .......................... | 361/686 |
| 6,034,868 A | * | 3/2000 | Paul ............................. | 361/684 |
| 6,111,755 A | * | 8/2000 | Park ............................ | 361/727 |
| 6,144,549 A | * | 11/2000 | Moss et al. .................. | 361/681 |
| 6,303,864 B1 | * | 10/2001 | Johnson et al. ............... | 174/69 |
| 6,305,556 B1 | * | 10/2001 | Mayer .......................... | 211/26 |
| 6,237,139 B1 | * | 12/2001 | Champion et al. ........... | 361/608 |
| 6,407,933 B1 | * | 6/2002 | Bolognia et al. ............. | 361/826 |

OTHER PUBLICATIONS

Jon Fortt –The Mercury News, May 15, 2002, article entitled "Apple Unveils New 1.75–inch Server," 2 pages.

* cited by examiner

Primary Examiner—Michael Datskovsky
(74) Attorney, Agent, or Firm—Rosenthal & Osha L.L.P.

(57) ABSTRACT

A mountable computer system includes a primary system structure and a cover. The cover is mountable to a support structure and supports the primary system structure therein. The primary system structure includes one or more connectors for attaching cables to the system. The cover is adapted to enable mating between cables and the primary system structure when inserted therein. The cover and primary system structure are also adapted to enable translation of the primary system structure in the cover with cables attached. A method for accessing computer system internal components includes: disengaging a primary system structure from an inserted position in a cover; sliding the primary system structure to an extended position in the cover while maintaining connection to cables attached to the primary system structure; releasably locking the primary system structure in the extended position in the cover; and accessing internal components disposed on the primary system structure.

21 Claims, 4 Drawing Sheets

SYSTEM STRUCTURE FOR FAST SERVICE ACCESS IN A RACK/CABINET

BACKGROUND OF INVENTION

1. Field of the Invention

The invention relates generally to computer system implementation. More particularly, the invention relates to network computer system hardware that is mountable to a support structure and allows for fast access to the computer system hardware for servicing.

2. Background Art

Network computer systems are computer systems that include the use of one or more servers. These systems may also be referred to as server systems. several types of servers exists that may be used in a network system, including, but not limited to, file servers that are typically dedicated to storing information, network servers that manage traffic on a computer network, and print servers that manage one or more printers. Server systems typically also include other equipment, such as hard disk drives for memory storage, one or more display screens, and keyboards or other input devices.

The physical configuration of larger server systems becomes important because of the number of servers and other equipment included in the system. Such server systems may occupy large amounts of floor space and may create problems with the space availability in a home and/or offices where the server systems are located.

In recent years, computer system manufacturers have taken steps to reduce the overall system space requirements for server systems. Because of the desire for smaller, more compact systems, attempts have been made to decrease the size of servers and associated equipment while increasing storage capacity of peripheral drives so that fewer drives are required. However, the size and storage capacity of server system components is limited by current technology. Therefore, a number of server system components are often required for a server system and may occupy a considerable amount of floor space.

To reduce the amount of floor space occupied by server systems, computer system manufacturers now typically offer computer equipment that may be mounted in a system support structure, such as a rack, a cabinet, or the like. In general, a rack is a frame or structure to which computer system components may be mounted. Some racks have two vertical rails to which computer equipment is mounted. Other, more common racks have four vertical mounting rails, as shown, for example, in FIG. 1.

Figure 1:
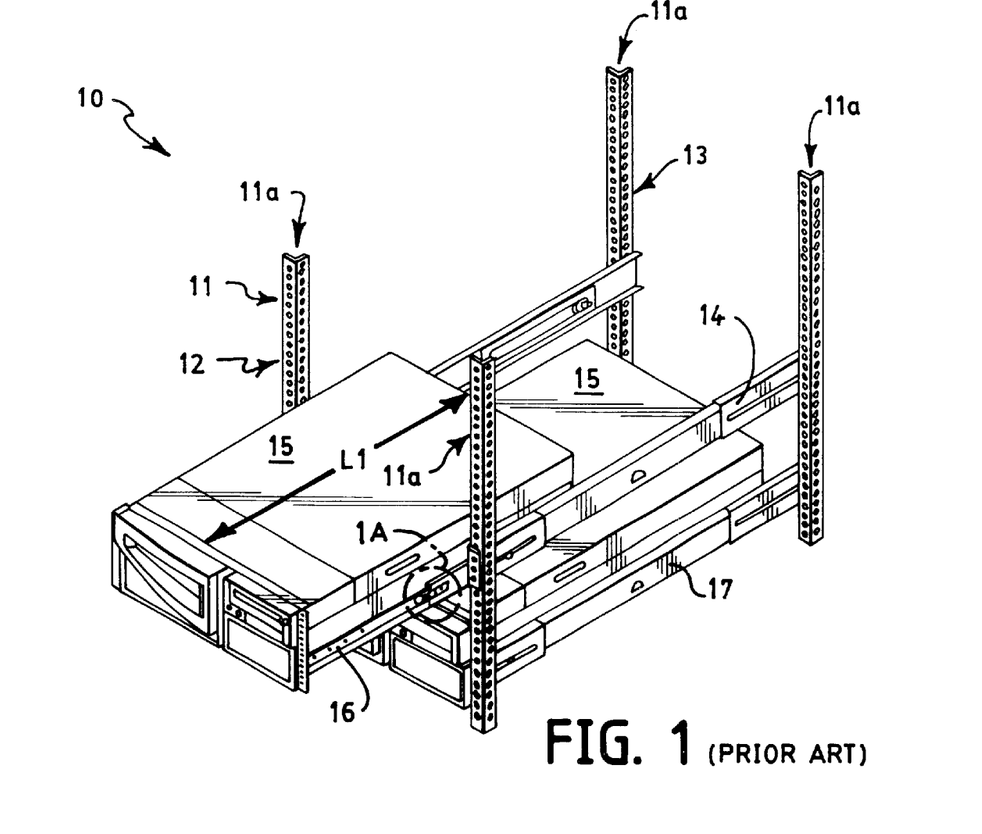
FIG. 1 shows a prior art computer system component mounted in a support structure.

As shown in FIG. 1, a rack-mounted computer system 10 typically includes at least one computer system component 15 mounted to a rack 11. The rack includes a plurality of rack rails 11a and is generally referred to as having a front side 12 and a back side 13. The component 15 typically is inserted into and accessed from the front side 12 of the rack 11, and power and connection cables for the component 15 are typically arranged at the back side 13 of the rack 11. The component 15 typically includes brackets (not shown) with holes that extend from each side of the component 15 for mounting the component 15 to the rack 11. The component 15 is typically mounted to the rack 11 by inserting it between rack rails 11a and coupling the brackets to the rack rails 11a, such as by bolts, screws, or the like. The component 15 is typically mounted in the rack 11 with its long axis L1 perpendicular to the front side 12 and back side 13 of the rack 11.

Computer cabinets are enclosed frames that typically include doors and side panels that may or may not be removable. Many cabinets include additional features, such as connections for electrical power, cooling systems with fans and baffles, and electromagnetic interference (EMI) and radio frequency interference (RFI) shielding to meet various system requirements and industry standards.

Figure 2:
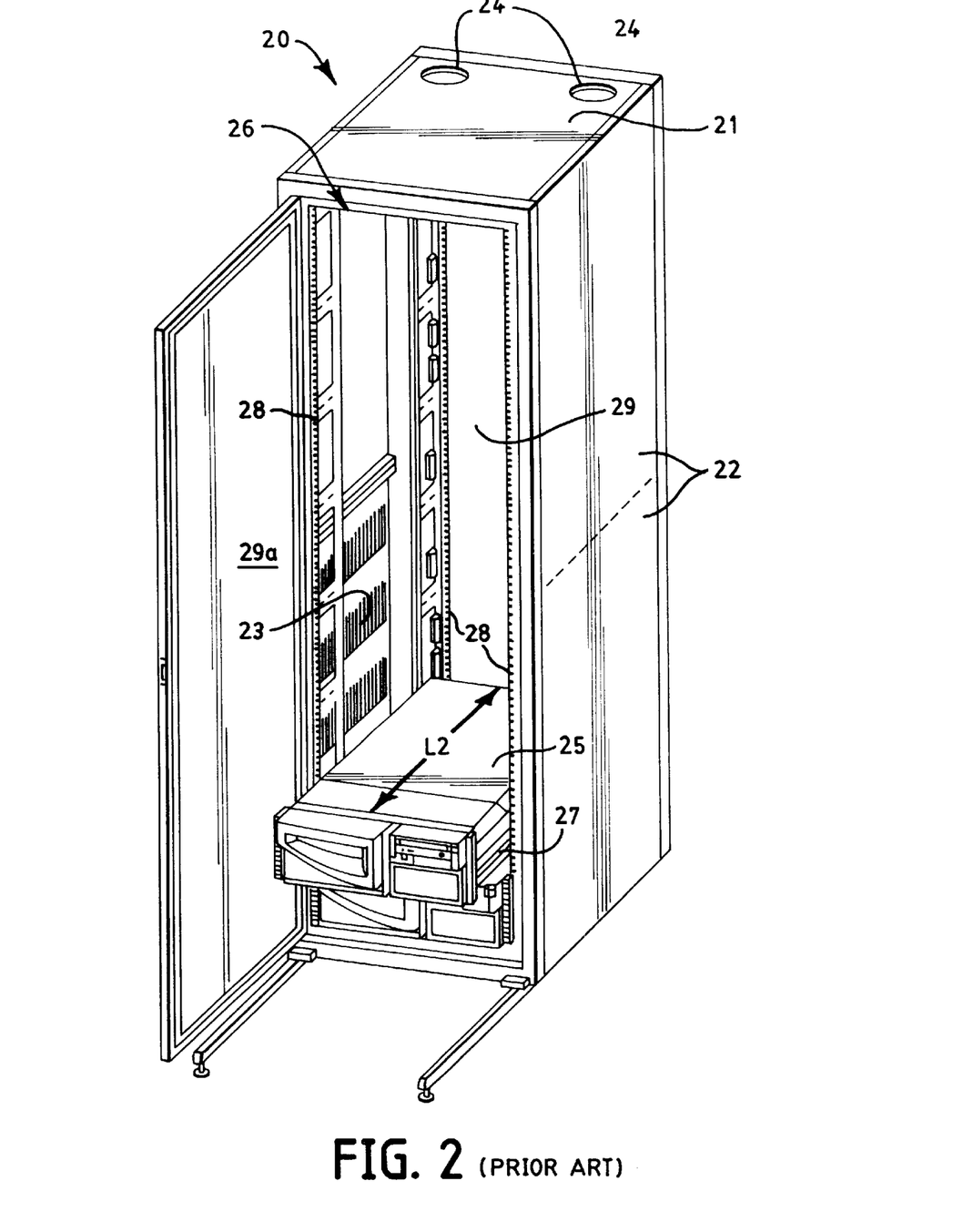
FIG. 2 shows a prior art computer system component mounted in a support structure.

As shown in FIG. 2, one example of a cabinet-mounted computer system includes a cabinet 20 having computer system components 25 mounted therein. The cabinet 20 includes a rack structure (rack rails 28) surrounded by an enclosure, which includes a top panel 21, bottom panel (not shown), removable side panels 22, a back panel 29 and a front door 29a. The top panel 21 and/or a side panel 22 may be equipped with air vents 23 and 24 to allow for air circulation through the cabinet. Components 25, such as servers, are typically mounted in the cabinet 20 so that a long axis L2 of the component is perpendicular to a front side 26 and back side 29 of the cabinet 20.

Recently, some larger rack systems, such as 4 rack unit (RU) systems offered by Sun Microsystems, Inc. and Compaq Computer Corporation, have been mounted in racks and cabinets using sliding rail systems, which enable extension of a component in and out of the rack without requiring unscrewing and lifting of the component from the rack. For example, as shown in FIG. 1, rails slides 16 may be attached to the sides of the component 15 configured to slide in and out of corresponding rail brackets 17 attached to corresponding sides of the rack 11. Similarly, as shown in FIG. 2, slide brackets 27 may be attached to each side of the component 25 which are configured to mate with and slide along corresponding rail slides (not shown) fixably mounted inside the cabinet 20.

Components mounted in racks using sliding rail systems slide in and out of a rack or cabinet similar to the sliding of a desk drawer. In such systems, cables must be detached from the back of a component before the component can be slid a significant distance out of the rack.

Figure 1A:
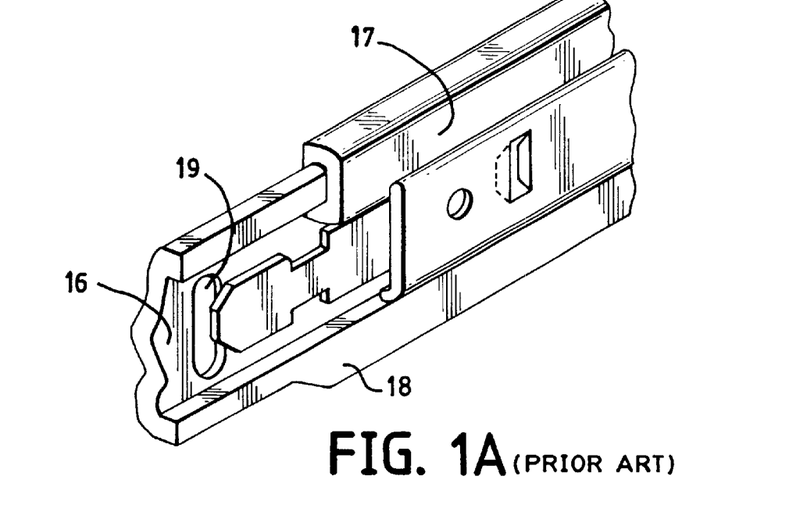
FIG. 1a shows a prior art sliding rail system in accordance with FIG. 1.

Some sliding rail systems may include a safety catch or other structure to prevent the system from falling out of the rack or cabinet when extended from the rack. For example, as shown in FIG. 1a, a sliding rail system may include a catch 18 coupled to an end of the rail bracket 17 and having a portion extending therefrom adapted to engage in an orifice 19 on the rail slides 16 as the component 15 move into an extended position out of the rack 11. The catch 18 is typically configured to automatically disengage from the orifice 19 when the component 15 is moved back into the rack 11. To remove the component 15 from the rack 11, the catch 18 is manually disengaged from the orifice 19 to allow rail slides 16 to slide in a forward direction with respect to the rail bracket 17.

Although mounting server systems in racks or cabinets may greatly reduce the amount of floor space the systems occupy, it often results in increased service time when a component of a system requires servicing or replacing. For example, for a typical rack-mounted system bolted to a rack, servicing a system component requires, among other steps, (1) disconnecting any cables and the power supply attached to the back of the component, (2) disconnecting the component from the rack or cabinet, (3) removing the component from the rack or cabinet, and (4) finding a suitable surface to place the component on so it can be serviced.

Typically, disconnecting a component from the rack requires unscrewing a number of bolts connecting mounting brackets of the component to the rack rails. Removing a component from the rack typically requires sliding the component out the front of the rack. Also, to service a component, (5) the lid or cover of the component typically has to be removed, such as unscrewed and lifted, to expose the internal elements of the component so faulty items can be replaced or repaired.

After servicing, replacing a component back in a rack system typically requires (6) reattaching the lid of the component, (7) sliding the component back into position in the rack, (8) aligning mounting holes of the component with mounting holes of the rack, (9) securing the component to the rack, such as by replacing the screws or mounting bolts, and (10) reconnecting all of the cables that were disconnected from the component prior to servicing.

These pre-servicing and post-servicing operations, numbered above, often result in significant down time for a system during servicing. This down time may be further amplified in cases in which re-cabling errors are likely to occur, such as when servicing major components of a server system or when servicing a component in a larger server system. When re-cabling errors occur, the system typically must be analyzed to detect and correct the re-cabling errors. This can contribute to significant down time for a system, even when sliding rails are used to facilitate quicker access to a component of the system.

Particularly for many prior art rack and cabinet systems that have multiple components, the cables at the back of the system can frequently become tangled or accidentally pulled out when disconnecting a component of the system for servicing or replacing. One prior art method for reducing tangled cables involves bundling cables together. However, this method results in large cable bundles that can make servicing components and re-cabling more difficult. Bundling cables, in some cases, may result in one or more cables being accidentally disconnected from a component of the system when cables are disconnected from another component for servicing. This, in turn, can lead to increased re-cabling errors.

To avoid such problems, some systems may include a cable management system, such as a cable extender arm or tension reducer, to manage the cables at the back of the system so they do not tense or pull out when the system is slid out the front. Cable extender arms typically are spring loaded metal members that hold a length of cable and extend forward to release slack in the cable when the cable is pulled forward and retract back when tension on the cable is released.

Additionally, Rackable Systems® has recently introduced a compact system configuration that does not require lids for intermediate hardware components in a system grouped in a cluster. In this system, when clusters of components are used, the base of a component above may serve as a lid for the component below it. Although aspects of this system configuration may be adapted to simplify the removal and attachment of lids for a system during servicing, these systems still require disconnecting and reconnecting of the cables at the back of the system each time the system is accessed for servicing.

A mountable computer system structure that allows for convenient service access to the system and a reduction of disruption time and down time for the system during servicing is desired. Additionally, a mountable computer system which simplifies or reduces the pre-servicing and post-servicing steps required for servicing the system is also desired.

SUMMARY OF INVENTION

In one aspect, the invention relates to a computer system comprising a primary system structure and a cover. The cover is mountable to a support structure and adapted to support the primary system structure when inserted therein. The primary system structure comprises a circuit board having at least one electronic device disposed thereon and at least one connector coupled to the circuit board. The connector is adapted to mate with at least one cable attachable to the computer system. The cover is adapted to enable mating of the at least one cable with the at least one connector when the primary system structure is inserted in the cover. The cover and primary system structure are also adapted to enable translation of the primary system structure with respect to the cover when the primary system structure is inserted in the cover and at the at least one cable is connected to the primary system structure.

In one aspect, the invention relates to a method for mounting a computer system to a support structure. In one embodiment, the method includes mounting a cover to the support structure, which is adapted to support a primary system structure therein and adapted to enable connection of at least one cable to the primary system structure when it is inserted in the cover. The method also includes removably inserting the primary system structure into a fully inserted position in the cover and releasably locking the primary system structure in place in the fully inserted position in the cover. The method also includes connecting at least one cable attachable to the computer system to at least one connector disposed on the primary system structure through an opening in a backside of the cover. The cover and the at least one cable are adapted to enable translation of the at least one cable with the primary system structure when the primary system structure translates with respect to the cover.

In one aspect, the invention also relates to a method for conveniently accessing internal components of a computer system that includes a primary system structure having internal components and a cover attached to a support structure and supporting the primary system structure in an inserted position therein. In one or more embodiments, the method includes disengaging a releasable locking mechanism between the cover and the primary system structure inserted in the cover. The primary system structure having at least one connector coupled to at least one cable attachable to the computer system. The method also includes sliding the primary system structure from the inserted position in the cover to an extended position in the cover while maintaining the at least one cable attached thereto to enable access to the internal components of the computer system. The method further includes releasably locking the primary system structure in the cover in the extended position and accessing the internal components of the computer system disposed on the primary system structure.

In one or more embodiments, the method may further comprise releasably unlocking the primary system structure from the cover in the extended position; sliding the primary system structure from the extended position in the cover to the inserted position in the cover; and engaging the primary system structure in releasable locking engagement with the cover in the inserted position.

Other aspects and advantages of the invention will be apparent from the following description and the appended claims.

DETAILED DESCRIPTION

Exemplary embodiments of the present invention will now be described with reference to the accompanying figures.

The invention relates to a mountable computer system. The mountable computer system may comprise a server, such as a one rack unit server illustrated, for example, in FIG. 3. However, those skilled in the art will appreciate that in other embodiments, the mountable computer system may comprise any computer hardware or equipment desired to be mounted in a rack, cabinet, or similar support structure. For example, a mountable computer system may include a disk drive, keyboard, display screen, or other computer equipment.

Figure 3:
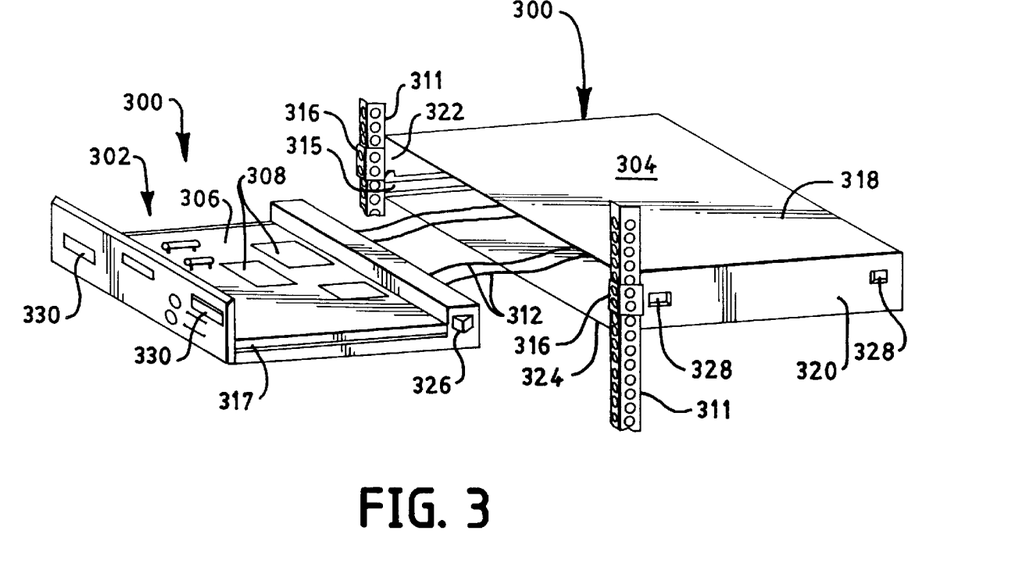
FIG. 3 shows a mountable computer system in accordance with an embodiment of the present invention.
Figure 4:
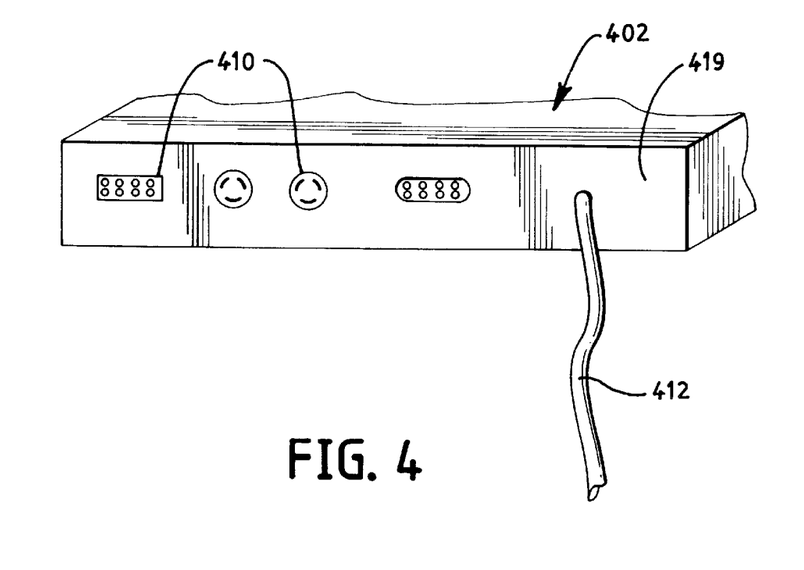
FIG. 4 shows a portion of a mountable computer system in accordance with an embodiment of the present invention wherein system connectors are disposed on a back side of a primary system structure.

Referring to FIG. 3, in accordance with one or more embodiments of the present invention, a mountable computer system 300 comprises a primary system structure 302 and a cover 304. The primary system structure comprises a circuit board 306 having at least one electronic device 308 disposed thereon and at least one connector (not shown in FIG. 3) coupled to the circuit board 306. The connector is adapted to mate with at least one cable 312 attachable to the computer system 300. One example of a plurality of connectors 410 disposed on an exterior back surface of a primary system structure 402 is shown in FIG. 4.

In accordance with one or more embodiments of the present invention, the cover 304 is adapted to be mountable to a support structure 311 and adapted to support the primary system structure 302 when inserted therein. The cover 304 is also adapted enable mating between the cable(s) 312 attachable to the system and the connector(s) (not shown) of the primary system structure 302 when the primary system structure is positioned in the cover 304. Additionally, the primary system structure 302 and cover 304 are adapted to enable translation of the primary system structure 302 with respect to the cover 304 when the primary system structure 302 is in the cover 304 and the cable(s) 312 are connected to the primary system structure 302.

Embodiments in accordance with the above description advantageously provide a primary system structure 302 that can be extended out of a cover 304 for servicing while maintaining connection of the cable(s) 312 attached to the system 300. Those skilled in the art will appreciate that the primary system structure should further include a power off switch or the like for powering down the system prior to servicing internal components of the system.

Referring to the exemplary embodiment shown FIG. 3, the primary system structure 302 and cover 304 may be adapted to enable translation of the primary system structure 302 with respect to the cover 304 using a sliding rail system, such as one described in the Background section. For example, as shown in FIG. 3, rail slides 317 may be disposed on opposing exterior side surfaces of the primary system structure 302 and corresponding side brackets 315 may be disposed on corresponding interior side surfaces of the cover 304 such that when the primary system structure 302 is inserted into the cover 304 the rail sides 317 slide along the slide brackets 315 to facilitate the translation of the primary system structure 302 in the cover 304.

Those skilled in the art will appreciate that in other embodiments, any mechanisms, surface configurations, or structures known in the art for mounting a member in translational engagement with another member may be used without departing from the spirit of the invention. For example, in other embodiments any drawer-type rail system or roller/rail systems may be used.

In one or more embodiments of the present invention, the cover 304 of the computer system 300 may comprise an enclosure having a generally hexahedral shape defined by at least three side walls and an open front side 314 for receiving the primary system structure 302 therein. The at least three sides of the cover 304 may include a top side 318, a right side 320, and a left side 322. The cover 304 may further comprise a bottom side 324. In one or more embodiments a top side 318 for the cover may be provided as part of a separate component mounted above the computer system 300, as discussed in the Background section. In one or more embodiments, a bottom side 324 of the cover may be provided as part of the primary system structure 302 or as part of a separate component mounted below the computer system 300.

In one or more embodiments of the present invention, the cover 304 is adapted to enable attaching one or more cables 312 to the primary system structure 302 when the primary system structure 302 is in the cover 304 and translation of the cables 312 with the primary system structure 302 when it is translated with respect to the cover 304. In the exemplary embodiment shown in FIG. 3, the cover 304 comprises a back side that is open to enable connection of cables 312 to the primary system structure 302 when inserted in the cover. Having a cover 304 with an open back side may enable substantial unrestricted translation of the cables 312 in and out of the cover 304 when the primary system structure 302 is translated with respect to the cover 304. In one or more embodiments, the back side of the cover 304 may comprise a wall having one or more openings therein through which cables 312 can be connected the primary system structure 302.

In accordance with one or more embodiments of the invention, cables 312 connected to the primary system structure 302 are allowed to translate with the primary system structure 302 when it is translated with respect to the cover 304, such as when the primary system structure 302 is accessed for servicing. For example, in one embodiment, the cables 312 may be securely coupled to the primary system structure 302 and arranged to hang unconstrained at the back of the computer system 300 such that when the primary system structure 302 is extended with respect to the cover 304, the cables 312 secured to the primary system structure 302 are free to travel with the primary system structure 302 relatively unconstrained. In another embodiment, translation of the cables 312 may be managed by a cable management system, such as a cable extender arm or tension reducer system, such as described in the Background section.

As shown in FIG. 4, in one or more embodiments, connectors 410 on the primary system structure 402 may be disposed on an exterior back side of the primary system structure 402. In general, the connectors 410 are configured to mate with a power source and/or cables 412, such as power cables, and/or other component cables, used to connect the computer system to other components of the system, such as other system hardware and/or peripheral devices. Those skilled in the art will appreciate that the invention is not limited to the location, configuration, type, or number of the system connectors 410 on the primary system structure 402.

Referring back to FIG. 3, in accordance with one or more embodiments of the present invention, the cover 304 further comprises at least one attachment 316 for securing the cover 304 to a support structure 311, such as a rack, cabinet, or the like. In the exemplary embodiment shown in FIG. 3, the at least one attachment 316 comprises conventional rack ears which are commonly used in prior art mountable systems to attach computer system components to support structures, such as racks. The attachments 316 may extend from opposing sides of the cover 304 proximal the front side 314 and/or back side of the cover 304. The attachments 316 may have holes disposed therein which correspond to holes in the support structure 311 for screwing, bolting, or otherwise securing the cover 304 to the support structure 311. Those skilled in the art will appreciate that the invention is not limited to the attachments 316 shown in FIG. 3. In one or more embodiments, any attachment method known in the art may be used to attach a cover to a support structure.

Figure 5A:
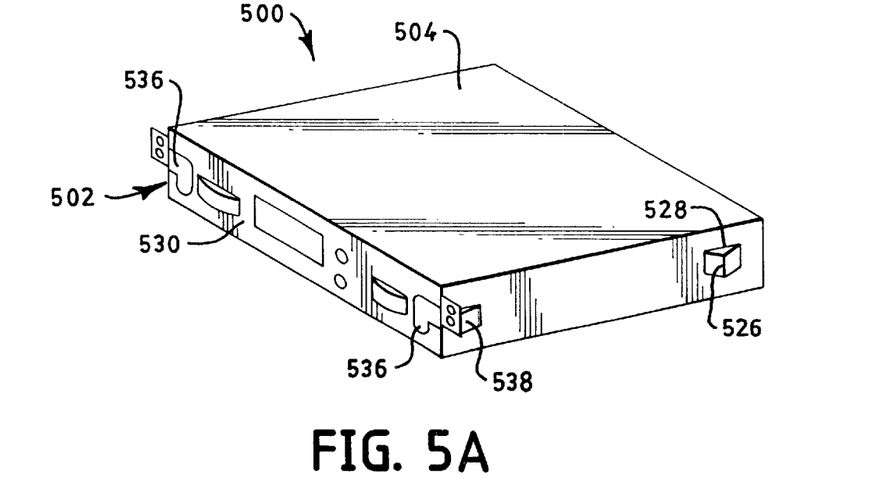
FIG. 5A shows a mountable computer system in accordance with an embodiment of the present invention wherein a primary system structure is in a fully inserted position in a cover.
Figure 5B:
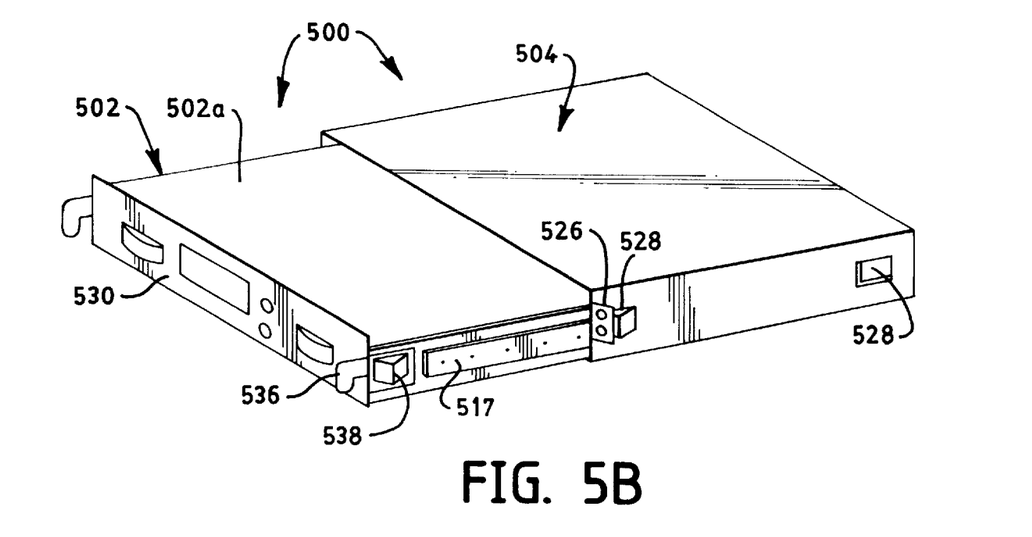
FIG. 5B shows a mountable computer system in accordance with an embodiment of the present invention wherein a primary system structure is in a fully extended position in a cover.

Now Referring to the exemplary embodiment shown in FIGS. 5A and 5B, in accordance with one or more embodiments of the present invention, the primary system structure 502 and cover 504 may be adapted to allow relatively unconstrained translation of the primary system structure 502 between a fully inserted position in the cover 504, (illustrated, for example, in FIG. 5A) and a fully extended position in the cover 504 (illustrated, for example, in FIG. 5B). The fully inserted position may be any select position that results in insertion of the primary system structure 502 in the cover or the covering of the internal components (i.e., circuit board and at least one electronic device) of the primary system structure 502 by the cover 504. The fully extended position may be any select position which enables the primary system structure 502 to be securely supported in the cover 504 while enabling access to the internal components on the primary system structure 502 intended to be serviced in the system 500. In one or more embodiments, the primary system structure 502 and cover 504 may also be adapted to enable securable intermediate positioning of the primary system structure 502 in the cover 504 between the fully inserted position and the fully extended position.

In one or more embodiments, the primary system structure 502 and the cover 504 may be adapted such that the primary system structure 502 releasably locks in a select position in the cover 504, such as by a securing mechanism when in the fully inserted position in the cover 504. For example, when the primary system structure 502 is moved into the fully inserted position in the cover 504, as shown in FIG. 5A, at least one securing mechanism 526 (see also 326 in FIG. 3), such as a latching mechanism on at least one side of the primary system structure 502, may move into alignment with a corresponding orifice 528 or recess in the cover 504 and releasably engage with the orifice 528 or recess. For the example shown in FIG. 5A, engagement of the securing mechanism 526 with the orifice 528 may be released by pressed inward on the securing mechanism 526 to disengage it from the orifice 528 and allow the primary system structure 502 to translate with respect to the cover 504. The invention is not limited to the type of securing mechanisms 526 that may be used for embodiments of the invention. Numerous securing mechanisms, such as releasable latching mechanisms and latching configurations (e.g., locking shoulders) are well known in the art and may be used as desired without departing from the spirit of the invention.

In one or more embodiments, the primary system structure 502 and the cover 504 may also be adapted to prevent the primary system structure 502 from accidentally falling out of the cover when the primary system structure 502 is pulled into the fully extended position. For example, the primary system structure 502 and/or cover 504 may include a securing mechanism 526 which releasably locks the primary system structure in the cover 504 when moved into the fully extended position. As shown for the exemplary embodiment in FIG. 5B, in one or more embodiments, at least one securing mechanism 526, such as latching mechanism (see also 326 in FIG. 3) on at least one side of the primary system structure 502 may move into alignment with an orifice 528 or recess in the cover 504 and releasably engage therein when the primary system structure 502 is moved to the fully extended position in the cover 504. To release engagement of the securing mechanism 526 with the orifice 528 or recess, the securing mechanism 526 may be depressed inward to disengage it from the orifice 528 and allow the primary system structure 502 to translate in or out of the cover 504.

In one or more embodiments, a securing mechanism 526 may be configured to releasably lock in a corresponding orifice 528 only when the primary system structure 502 is moving in a specific direction, such as in an extended direction with respect to the cover 504. For example, the securing mechanism 526 may comprising a triangular-shaped member spring-loaded to extend from an orifice in a side of the primary system structure 502 when unrestricted by the cover 504. Thus, when the primary system structure 502 is moved in an extended direction with respect to the cover 504 and the triangular-shaped member aligns with and engages in the orifice 528 such that a base of the triangular-shaped member engages against the forward side of the orifice 528 closest to the front side of the cover 504. When the primary system structure 502 is pushed in an inward or inserted direction with respect to the cover 504, a sloped side of the triangle-shaped member presses against the back side of the orifice 528 closest to the back side of the cover 504 and forces the triangle-shaped member inward into its retracted position in the primary system structure 502, disengaging it from the orifice 528.

Those skilled in the art will appreciate that any type of securing mechanisms may be used to releasably lock the primary system structure 502 in selected positions in the cover 504. For example, numerous securing mechanisms, such as releasable latching mechanisms and latching configurations (e.g., locking shoulders) are well known in the art and may be used without departing from the spirit of the invention.

Referring to FIGS. 5A and 5B, in accordance with one or more embodiments of the invention, the mountable computer system 500 may further comprise an injector/ejector mechanism to assist in the injection and/or ejection of the primary system structure 502 in or out of the cover 504. For example, a face plate having injector/ejector handles 536 may be disposed on a front side 530 of the primary system structure 502. The injector/ejector handles 536 may be positioned on the right and left sides of the face plate and may each include an outward facing protrusion 538 which can be moved into locking engagement with a orifice 528 or recess proximal the front side of the cover 504. To engage the primary system structure 502 in releasable locking engagement with the cover 504, a force may be applied to each injector/ejector handle 536 to push the primary system structure 502 into the fully inserted position in cover 504 and rotate the injector/ejector handles 536 inward toward each other until they are flat against the face plate. The rotation of the injector/ejector handles 536 against the face plate also results in engagement of the protrusion 538 on the sides of the handles 536 with the orifice 528 or recess in the cover 504. To release the primary system structure 502 from the cover 504, a force may be applied to the injector/ejector handles 536 to rotate them away from each other and the face plate, which disengages the protrusion 538 from the orifice 528, thereby ejecting the primary system structure 502 from locking engagement with the cover 504. Once the injector/ejector handles 536 are released from locking engagement with the cover 504, they may be used to pull the primary system structure 502 from the inserted position in the cover 504.

Those skilled in the art will appreciate that in other embodiments, any injector or ejector mechanisms may be used to assist in the engagement or disengagement of the primary system structure 502 with the cover 504. Numerous types of injector/ejector mechanisms are well known in the art for this purpose, such as those marketed as sold by One Stop Systems in Escondido, Calif.

As illustrated in FIG. 5B, in one or more embodiments of the present invention, the primary system structure 502 may further include a protective housing 502a that covers a portion of the circuit board (for example, 308 in FIG. 3) of the primary system structure 502 to further protect individual electronic components mounted on the circuit board in situations where adverse ambient conditions may cause damage to a component of the system 500. In one or more embodiments, the primary system structure 502 having a protective housing 502a may be designed to be removed for servicing or discarded upon failure of a component and replaced by a new primary system structure 500 for convenience or fast servicing. Alternatively, the protective housing 502a may be configured to be easily opened or removed for servicing on site.

Those skilled in the art will appreciate that in accordance with embodiments of the invention described above, the primary system structure or entire system may be completely removed from the rack for servicing, as is currently done with existing systems. For instance, when a primary system structure is mounted in a high position in a support structure, complete removal of the primary system structure could be chosen. As noted for one or more embodiments above, the system may be configured such that complete removal of the system from the support structure requires a second deliberate operation, such as disengagement of a securing mechanism that automatically activates when the system is pulled out into the fully extended position. Such safety features are commonly used in prior art drawer structures to prevent drawers from falling out when pulled into a fully extended position. Any conventional safety feature that allows for removal of the primary system structure from the cover may be used with other embodiments of the invention as desired.

In one aspect, the present invention also provides a method for mounting a computer system in a support structure for fast service access to the system. The method includes mounting a cover of the system to the support structure, wherein the cover is adapted to support a primary system structure therein and adapted to enable connection of at least one cable to the primary system structure when it is inserted therein. The method also includes removably inserting a primary system structure into a fully inserted position in the cover, wherein the primary system structure comprises a circuit board having at least one electronic device disposed thereon and at least one connector coupled to the circuit board. The connector of the primary system structure being configured to mate with the cable(s) attachable to the computer system. The method further includes releasably locking the primary system structure in the fully inserted position in the cover and connecting cables to the connectors of the primary system structure through an opening in the back side of the cover. The cover and cables being configured and arranged to enable translation of the cables with the primary system structure when the primary system structure is translated with respect to the cover, such as during servicing.

In one aspect, the present invention also provides a method for conveniently accessing internal components of a computer system mounted in a support structure. The computer system includes a primary system structure having the internal components disposed thereon and a cover supporting the primary system structure therein. The method includes disengaging a releasable locking mechanism between the cover attached to the support structure and the primary system structure inserted in the cover. The primary system structure having at least one connector coupled to at least one cable attached to the computer system. The method also includes sliding the primary system structure from the inserted position in the cover to an extended position in the cover while maintaining attachment to the cables, and releasably locking the primary system structure in the cover in the extended position. The method also includes accessing the internal components of the computer system disposed on the primary system structure. In one or more embodiments, the method may further comprise releasably unlocking the primary system structure from the cover in the extended position; sliding the primary system structure from the extended position in the cover to the inserted position in the cover; and engaging the primary system structure in releasable locking engagement with the cover in the inserted position.

In accordance with one or more embodiments of the invention, because the computer system enables easy translation of the primary system structure in and out of a cover that remains attached to the support structure and allows translation of the cables with the primary system structure, fast service access to the system can be easily achieved without requiring the disconnection or reconnection of cables at the back of the system.

Advantages of the present invention may include one or more of the following in one or more embodiments. Because the cables are allowed to translate with the primary system structure, disconnection of cables is not required when the primary system structure is extended from the cover for servicing. Rather, the power of the system can simply be turned off during servicing. Thus, problems associated with disconnecting cables and re-cabling errors can be avoided. Once the primary system structure has been serviced, it may be simply pushed back into the cover like a drawer and the power turned on to resume operation of the system. This not only reduces down time during servicing of the system, but also eliminates potential re-cabling errors after servicing. Those skilled in the art will appreciate that, if desired, any additional features, such as a cable management system or tension reducer system, may be used with embodiments of the invention to further assisted in the management of cables attached to the system.

Further, in accordance with one or more embodiments of the invention, by providing a primary system structure that can translate with respect to a cover that can remain attached to the support structure, server components, such as disk drives, chips, or memory, may be added, removed, or serviced by simply moving the primary system structure to an extended position in the cover, as shown in FIG. 5A. Thus, the pre-servicing and post-servicing steps for such systems may be essentially reduced to simply opening and closing a drawer.

In one or more embodiments, features such as injector/ejector mechanisms may be used to quickly snap a primary system structure for a server in and out of an engaged position with a cover so that it may be easily pulled out of the cover to either remove a component of the server for servicing or to exchange or replace the entire server. In accordance with one or more embodiments of the present invention, the only time the cables have to be disconnected from the system is when the entire primary system structure needs to be replaced by a new primary system structure. In accordance with one or more embodiments, the time required for servicing components is reduced and the need to find an area to place a system on for servicing can be eliminated. Also, in accordance with one or more embodiments, the need to disconnect and remove a cover from the system for. servicing can be eliminated.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system mountable to a support structure, comprising:
   a primary system structure including a circuit board having at least one electronic device disposed thereon and at least one connector coupled to the circuit board, the connector adapted to mate with at least one cable attachable to the computer system;
   a cover attachable to the support structure and adapted to support the primary system structure when inserted therein, the cover adapted to enable mating of the at least one cable with the at least one connector when the primary system structure is inserted in the cover, the cover and the primary system structure adapted to enable translation of the primary system structure with respect to the cover when the primary system structure is inserted in the cover and the at least one cable is connected to the primary system structure.

2. The computer system of claim 1, wherein the cover comprises a generally hexahedral shaped enclosure having at least three sides comprising walls and an open front side for receiving the primary system structure therein.

3. The computer system of claim 2, wherein the at least three sides comprise a top side, a right side, and a left side.

4. The computer system of claim 3, wherein the cover further comprises a bottom side.

5. The computer system of claim 1, wherein the at least one connector is disposed along a rear portion of the primary system structure.

6. The computer system of claim 1, wherein the cover comprises an open back side which enables the mating of the at least one cable with the at least one connector when the primary system structure is inserted in the cover.

7. The computer system of claim 1, wherein the primary system structure further comprises a protective housing covering a surface of the circuit board having the at least one electronic device disposed thereon, and the at least one connector is accessible from outside of the protective housing.

8. The computer system of claim 1, wherein the primary system is releasably securable in a select position in the cover.

9. The computer system of claim 1, wherein the primary system structure and the cover are adapted to allow translation of the primary system structure between a fully inserted position and a fully extended position in the cover.

10. The computer system of claim 9, wherein the primary system is releasably securable to the cover when in the fully inserted position in the cover.

11. The computer system of claim 10, wherein at least one member on at least one side of the primary system structure aligns with and releasably engages with an orifice in the cover when the primary system structure is moved into the fully inserted position in the cover.

12. The computer system of claim 9, wherein the primary system is releasably securable to the cover when in the fully extended position in the cover.

13. The computer system of claim 12, wherein at least one member on at least one side of the primary system structure aligns and releasably engages with an orifice in the cover when the primary system structure is moved into the fully extended position in the cover.

14. The computer system of claim 1, wherein the computer system comprises a rack mountable computer server for a network computer system.

15. The computer system of claim 14, wherein the rack mountable computer server comprises a one rack unit computer server.

16. A rack mountable computer server for a network computer system, the server comprising:
   a primary system structure including a circuit board having at least one electronic device disposed thereon and at least one connector coupled to the circuit board and configured to mate with at least one cable attachable to the server, the at least one system connector disposed along a rear portion of the primary system structure; and
   a cover attachable to the rack and adapted to support the primary system structure therein, the cover adapted to allow mating of the at least one cable with the at least one connector when the primary system structure is inserted in the cover, the cover comprising
      a generally hexahedral shaped enclosure having a top side, a right side, and a left side comprising walls, an open front side for receiving the primary system structure therein, and an open back side that allows the mating of the at least one cable to the at least one connector when the primary system structure is inserted in the cover,
   the primary system structure and the cover adapted to allow translation of the primary system between a fully inserted position and a fully extended position in the cover with the at least one cable connected to the primary system structure, at least one member on at least one side of the primary system structure adapted to move into alignment with and releasably engage with a first orifice in the cover when the primary system structure is in the fully inserted position in the cover and adapted to move into alignment with and releasably engage with a second orifice in the cover when the primary system structure is in the fully extended position in the cover.

17. The computer server of claim 16, wherein the primary system structure further comprises a protective housing covering a surface of the circuit board having the at least one electronic device disposed thereon, and the at least one connector accessible from outside of the protective housing.

18. The computer server of claim 16, wherein the server comprises a one rack unit computer server.

19. A method for mounting a computer system in a support structure, comprising:

mounting a cover to the support structure, the cover adapted to support a primary system structure therein and adapted to enable connection of at least one cable to the primary system structure when inserted therein;

removably inserting the primary system structure into a fully inserted position in the cover, the primary system structure having at least one connector adapted to connect with the at least one cable attachable to the computer system;

releasably locking the primary system structure in place in the fully inserted position in the cover; and connecting the at least one cable to the at least one connector through an opening in a back side of the cover, the cover and the at least one cable adapted to enable translation of the at least one cable with the primary system structure when the primary system structure translates with respect to the cover.

20. A method for conveniently accessing internal components of a computer system mounted in a support structure, the computer system including a primary system structure having the internal components disposed thereon and a cover adapted to support the primary system structure therein, the method comprising:

disengaging a releasable locking mechanism between the cover attached to the support structure and the primary system structure in an inserted position in the cover, the primary system structure having at least one connector coupled to at least one cable attachable to the computer system;

enabling access to the internal components of the computer system by sliding the primary system structure from the inserted position in the cover to an extended position in the cover while maintaining the at least one cable attached thereto;

releasably locking the primary system structure in the cover in the extended position; and accessing the internal components of the computer system disposed on the primary system structure.

21. The method of claim 20, further comprising:

releasably unlocking the primary system structure from the cover in the extended position;

sliding the primary system structure from the extended position in the cover to the inserted position in the cover; and engaging the primary system structure in releasable locking engagement with the cover in the inserted position.

* * * * *